(12) United States Patent
Tanabe

(10) Patent No.: US 6,667,188 B2
(45) Date of Patent: Dec. 23, 2003

(54) THIN FILM TRANSISTOR AND METHOD FOR FABRICATING SAME

(75) Inventor: Hiroshi Tanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/272,071

(22) Filed: Oct. 16, 2002

(65) Prior Publication Data

US 2003/0052337 A1 Mar. 20, 2003

Related U.S. Application Data

(62) Division of application No. 09/656,631, filed on Sep. 7, 2000.

(30) Foreign Application Priority Data

Sep. 17, 1999 (JP) ............................................ 11-263635

(51) Int. Cl.[7] .............................................. H01L 21/00
(52) U.S. Cl. ......................... 438/48; 438/128; 438/149; 438/151; 438/157; 438/283
(58) Field of Search ......................... 438/48, 128, 149, 438/151, 157, 283

(56) References Cited

U.S. PATENT DOCUMENTS

| | | | | | |
|---|---|---|---|---|---|
| 6,093,586 | A | * | 7/2000 | Gosain et al. | 438/162 |
| 6,232,142 | B1 | * | 5/2001 | Yasukawa | 438/69 |
| 6,358,766 | B1 | * | 3/2002 | Kasahara | 438/30 |
| 2002/0048869 | A1 | * | 4/2002 | Gosain et al. | 438/166 |

* cited by examiner

Primary Examiner—Hoai Ho
Assistant Examiner—Andy Huynh
(74) Attorney, Agent, or Firm—Choate, Hall & Stewart

(57) ABSTRACT

In a thin film transistor provided with a metallic layer with a light-shading property and a Si layer formed on an insulating layer, a dent for locally thinning the insulating layer is formed on a portion corresponding to a drain region. When the Si layer is recrystallized by means of a laser light irradiation, the dent serves as a crystalline nucleus formation region in order to recrystallize a particular portion earlier than other portions. Recrystallization of melted Si starts from a periphery of a bottom surface of the dent, hence a Si layer formed of a single crystal or uniformed crystal grains which serves as an active region of the TFT can be obtained.

6 Claims, 11 Drawing Sheets

THIN FILM TRANSISTOR AND METHOD FOR FABRICATING SAME

This application is a divisional of U.S. patent application Ser. No. 09/656,631, filed on Sep. 7, 2000 (pending).

FIELD OF THE INVENTION

This invention relates to a thin film transistor used in an electronic instrument, such as a display, a sensor or a printing device, or a semiconductor device, such as a memory or a CPU, and a method for fabricating the same.

BACKGROUND OF THE INVENTION

Hitherto, a technology for fabricating a thin film transistor (a TFT, hereinafter) formed of hydrogenated amorphous Si (a-Si:H) or polycrystalline Si has been developed and put to practical use as a representative technology for fabricating the TFT on an insulating substrate such as a glass substrate.

In the technology for fabricating the hydrogenated amorphous Si (a-Si:H) TFT, the maximum temperature in the fabrication process is about 300° C., and the carrier mobility of about 1 $cm^2/Vsec$ is realized.

Accordingly, the TFT fabricated by using the aforementioned technology is used as a switching transistor for each pixel in an active matrix liquid crystal display (an AM-LCD, hereinafter), and in this case, the pixel-TFT is driven by a driver circuit (an IC or a LSI fabricated on a Si substrate formed of a single crystal).

Moreover, since each pixel is provided with the switching TFT in the AM-LCD, a cross talk is reduced. And an image with an excellent quality can be obtained as compared with a passive matrix LCD.

On the other hand, in the technology of the TFT formed of polycrystalline Si, the high carrier mobility of 30 to 100 $cm^2/Vsec$ can be realized by using the high temperature fabrication process which is similar to that of a LSI based on a $SiO_2$ substrate and conducted in the maximum temperature of about 1000° C. Accordingly, if the aforementioned technology is applied to the LCD, the pixel-TFTs and the peripheral driving circuits for the pixel-TFTs can be formed on the same glass substrate.

Moreover, according to the conventional technology, due to recent tendency that the LCD is compact and the resolution of the picture thereof is improved, it becomes extremely difficult to join the ICs serving as the peripheral drivers with the AM-LCD substrate by means of TAB connection or wire bounding because of a narrow pitch of joining. However, this difficulty can be overcome by means of the TFTs formed of polycrystalline Si, fabrication cost can be cut down, and products can be small sized.

However, according to the technology of the TFT formed of polycrystalline Si, since the fabrication process is carried out in a high temperature, glass with low softening temperature and with a low cost which has been used in a fabrication process of the TFT formed of hydrogenated amorphous Si cannot be used.

Accordingly, in order to reduce the maximum temperature in the fabrication process of the TFT formed of polycrystalline Si, a method for forming a polycrystalline Si layer in a low temperature region by means of laser crystallization technology is being studied and developed.

In general, a laser pulse irradiation apparatus realizes a crystallization technology by means of laser irradiation with a structure shown in FIG. 1.

A laser light which functions as an energy beam and is emitted from a pulse laser light source passes through an optical path regulated by optics, such as mirrors and a beam homogenizer for spatially homogenizing a light intensity, and reaches a Si layer formed on a glass substrate 5.

Since a region irradiated by the laser light is far smaller than the glass substrate in most cases, the laser light irradiates a desired position by displacing the glass substrate by means of a x-y stage. A method that the aforementioned optics are displaced without using the x-y stage or both the optics and the stage are displaced is adopted also.

The polycrystalline Si layer formed by laser irradiation is used for a TFT as shown in FIG. 2.

In the TFT shown in FIG. 2, a channel region 7, a source region 8, a drain region 9 and a lightly doped drain (a LDD, hereinafter) region 14 are formed on a glass substrate 5 covered with a substrate-coating layer 19, and agate insulating layer 12 and a gate electrode 10 are formed thereon. Moreover, a $SiO_2$ layer 4 is deposited, and a metallic layer 11 is formed in a contact hole.

The LDD regions 14 which are provided for the TFT and serve as offset gate regions suppress an off-leak current caused by trap levels which are generated around grain boundaries with high density in the polycrystalline Si semiconductor.

However, according to the aforementioned method for forming a polycrystalline Si layer by means of laser irradiation, grain sizes widely vary in a range extending from several nm to several $\mu$m in accordance with an intensity of a laser light, a width of a pulse and the number of the pulses, and it is difficult to uniformly grow crystal grains with a desired grain size at a desired position. Especially, in crystallization by means of an excimer laser, since nucleation occurs in an extremely short time in the order of nano second in the processes of a laser light absorption and recrystallization of the Si layer, it is very difficult to uniformly grow the crystal grains at a desired position.

The engineer of the semiconductor device faces the aforementioned difficulties in case that he tries to grow a polycrystalline Si layer in a solid phase or to directly deposit the same on a glass substrate as well as in case that he tries to form the same by means of laser crystallization technology.

As mentioned in the above, since the states of the grain boundaries are not uniform in the conventional TFTs, the off-leak currents fluctuate, and this difficulty is not overcome even if the LDD regions are formed at both the side ends of the channel region, hence the off-leak current cannot be precisely reduced as a result.

A semiconductor IC comprising the TFT which reduces the off-leak current by means of low density off set gate regions (LDD regions) formed in the channel region is disclosed in Japanese Patent 2525707 as a technology for overcoming the aforementioned difficulty.

However, since the state of the grain boundaries of the TFT is not uniform as mentioned in the above, the off-leak current cannot be precisely reduced. Especially, in the step of crystallizing the Si layer by means of the excimer laser irradiation, generation of the crystalline nucleuses cannot be controlled, and the aforementioned difficulty cannot be completely overcome.

Moreover, in a semiconductor device for overcoming the aforementioned difficulty disclosed in Japanese Patent Application Laid-open No. 9-293870, an electrical conductive layer with a high heat conductance is inserted between a glass substrate and an alkali metallic ion-obstructing layer.

In the aforementioned technology, melted Si is almost uniformly cooled and solidified, and a polycrystalline Si layer composed of crystal grains with a particular orientation can be obtained. Although a TFT with the high carrier mobility can be obtained by the aforementioned technology, an off-leak current cannot be precisely reduced, and location of nucleation cannot be precisely controlled, hence the aforementioned problem cannot be completely solved.

In the aforementioned TFT disclosed in Japanese Patent Application Laid-open No. 9-293870, the structure of a lamination of the TFT is described as an electrical conductive layer with a high heat conductance/a gate electrode/an insulating layer/a Si layer, which is radically different from a structure of an embodiment of the present invention (an electrical conductive layer with a high heat conductance/an insulating layer/a Si layer/an insulating layer/a gate electrode). Accordingly, it can be concluded that the TFT according to the present invention is different from that according to Japanese Patent Application Laid-open No. 9-293870 in their objects and effects.

SUMMARY OF THE INVENTION

Accordingly, it is an object of the invention to provide a thin film transistor and a method for fabricating the same, in which an off-leak current caused by trap levels formed around grain boundaries is radically reduced by eliminating the grain boundaries in accordance with a single crystallization of Si layers.

It is a further object of the invention to provide a thin film transistor and a method for fabricating the same, in which an off-leak current and the fluctuation thereof are precisely reduced by forming size-controlled crystal grains at desired locations.

According to the first feature of the invention, a thin film transistor comprises:

a cooling layer formed on a substrate, an insulating layer formed on the cooling layer, a heat conductivity of the cooling layer being higher than that of the insulating layer, and a semiconductor layer which is formed on the insulating layer and comprises a drain region, a channel region and a source region, wherein the cooling layer is locally close to at least one of the drain region, the channel region and the source region.

According to the aforementioned structure, in case that the Si layer formed on the insulating layer is irradiated with an excimer laser beam to form a crystalline Si layer, crystalline nucleuses are formed on a portion of an active region (the drain, channel and source regions) which is locally close to the cooling layer, and crystallization starts from the crystalline nucleuses towards regions where melted Si layer is cooled a certain time later.

Accordingly, a Si layer formed of a single crystal or size-controlled crystal grains can be made up by epitaxially growing a Si layer around the crystalline nucleuses, and the TFT which radically reduces an off-leak current caused by trap levels generated around grain boundaries can be fabricated by means of the aforementioned Si layer, hence the off-leak current of the TFT can be precisely reduced.

In the structures according to claims 2 and 3, either of at least one of the drain, channel and source regions or the cooling layer closely approaches the remainder.

As mentioned in the above, since the engineer of the semiconductor device is given a wide range of choice in designing the structure of the cooling layer and an active region (the drain, channel and source regions) of a semiconductor device, degree of freedom in the design is increased, and the optimum design can be performed.

In the structure according to claim 4, a gate electrode is formed on the channel region, and the drain region closely approaches the cooling layer.

Accordingly, since a single crystal region or an size-controlled crystal grain region can be formed in the neighborhood of the drain region, that is to say, in the channel region, the off-leak current can be effectively reduced.

Explaining concretely, the off-leak current in the drain region peculiar to polycrystalline Si can be reduced by designing the TFT so that a Si layer formed of a single crystal is made up in the neighborhood of the drain region.

In the structure according to claim 5, the cooling layer of the TFT has a shadowing property.

According to the aforementioned structure, photo-carriers can be prevented from being generated in condition an external light illuminates the TFT, and thereby a wrong operation can be avoided. The aforementioned characteristic is appreciated in a LCD used in a liquid crystal projector, which is exposed to a strong light, and especially in the TFT for driving a pixel in a liquid crystal.

According to the second feature of the invention, a method for fabricating a TFT comprises the steps of:

forming a cooling layer with a high heat conductivity on a substrate, forming an insulating layer with a lower heat conductivity than that of the cooling layer on the cooling layer, locally thinning the insulating layer, forming a semiconductor layer on the locally thinned insulating layer, and irradiating the locally thinned insulating layer with an energy beam.

A method for fabricating a TFT according to claim 7 comprises the steps of:

forming a semiconductor layer on a substrate, forming a cooling layer with a higher heat conductivity than that of the semiconductor layer on the semiconductor layer, patterning the cooling layer, irradiating the semiconductor layer and the cooling layer with an energy beam, and removing at least a portion of the cooling layer.

As mentioned in the above, a Si layer formed of a single crystal region or a size-controlled crystal grain region can be made up by forming a cooling layer on the Si layer and by patterning the same, and thereby the off-leak current can be reduced radically and precisely.

BRIEF DESCRIPTION OF THE DRAWINGS

The invention will be explained in more detail in conjunction with the appended drawings, wherein:

FIGS. 3A to 3C show an outline of a TFT according to the first preferred embodiment of the invention, wherein FIG. 3A is a top view for showing a structure of a TFT at an early stage of a fabrication process. FIG. 3B is a cross-sectional view of a structure shown in FIG. 3A taken along a line A—A, and FIG. 3C is a cross-sectional view for showing a structure of a TFT in the final stage of a fabrication process, FIGS. 4A and 4B show an outline of a TFT according to the first example of application, wherein FIG. 4A is a cross-sectional view for showing a structure of a TFT in an early stage of a fabrication process, and FIG. 4B is a cross-sectional view for showing a structure of a TFT in the final stage of a fabrication process, FIGS. 5A and 5B show an outline of a TFT according to the second example of application, wherein FIG. 5A is a cross-sectional view for showing a TFT in an early stage of a fabrication process, and FIG. 5B is a cross-sectional view for showing an outline of a structure of a TFT in the final stage of a fabrication process, FIGS. 6A and 6B shows an outline of a structure of a TFT according to the third example of application, wherein FIG. 6A is a cross-sectional view for showing a TFT in a nearly stage of a fabrication process, and FIG. 6B is a cross-sectional view for showing a structure of a TFT at the final stage of a fabrication process, FIGS. 7A and 7B shows an outline of a structure of a complementary MOS (a CMOS) using a TFT according to the fourth example of application, wherein FIG. 7A is a cross-sectional view for showing an outline of a structure of TFT in an early stage of a fabrication process, and FIG. 7B shows a structure of a TFT in the final process of a fabrication process, FIGS. 12A and 12B show an outline of a portable scanner using TFTs according to the invention, wherein FIG. 12A shows a perspective view for showing an internal structure of the same, and FIG. 12B is an enlarged cross-sectional view for showing the same.

DESCRIPTION OF THE PREFERRED EMBODIMENTS

Thereafter, preferred embodiments of TFTs and methods for fabricating the same will be explained referring to the appended drawings.

First, a TFT according to the first preferred embodiment of the invention will be explained.

The First Preferred Embodiment

Figure 1:
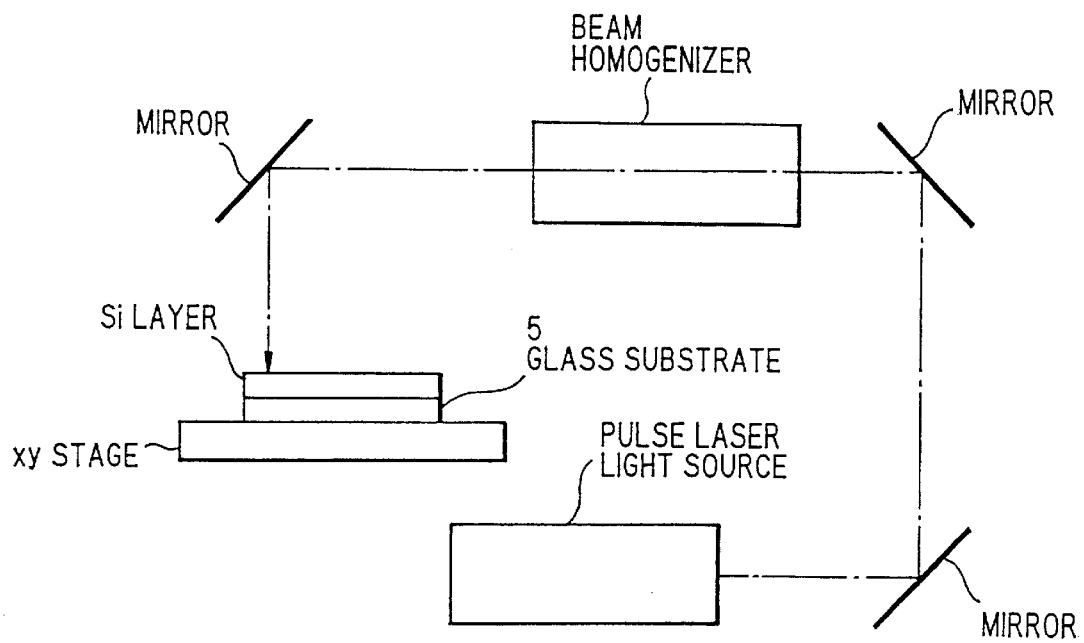
FIG. 1 shows an outline of a laser pulse irradiation apparatus.
Figure 2:
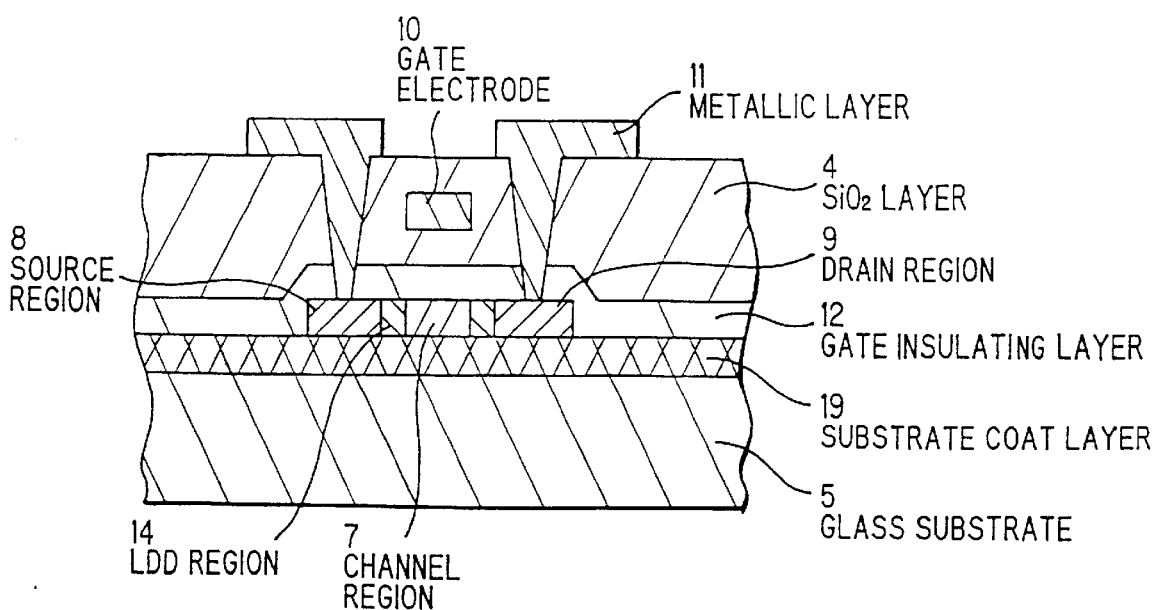
FIG. 2 is a cross-sectional view for showing a structure of a conventional TFT.
Figure 3A:
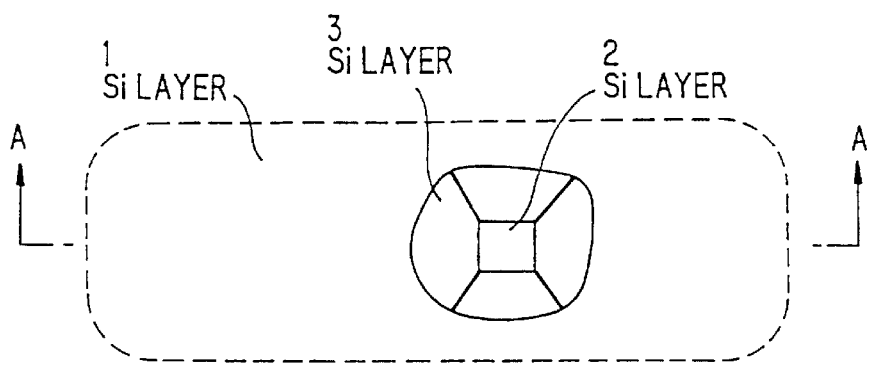
Figure 3B:
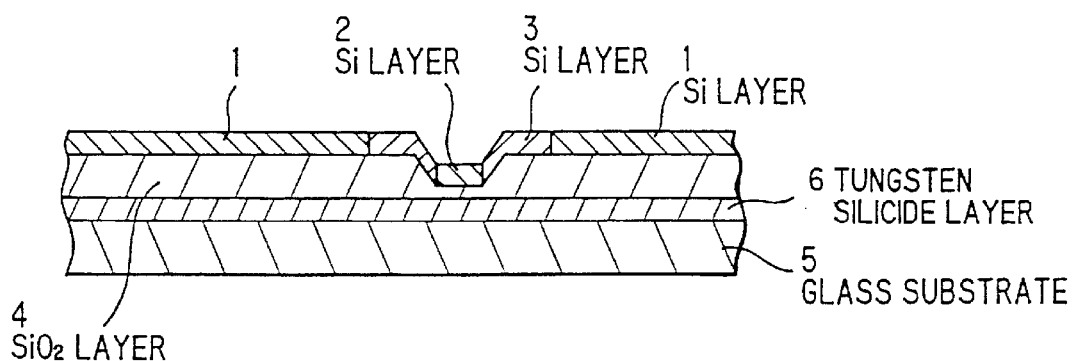
Figure 3C:
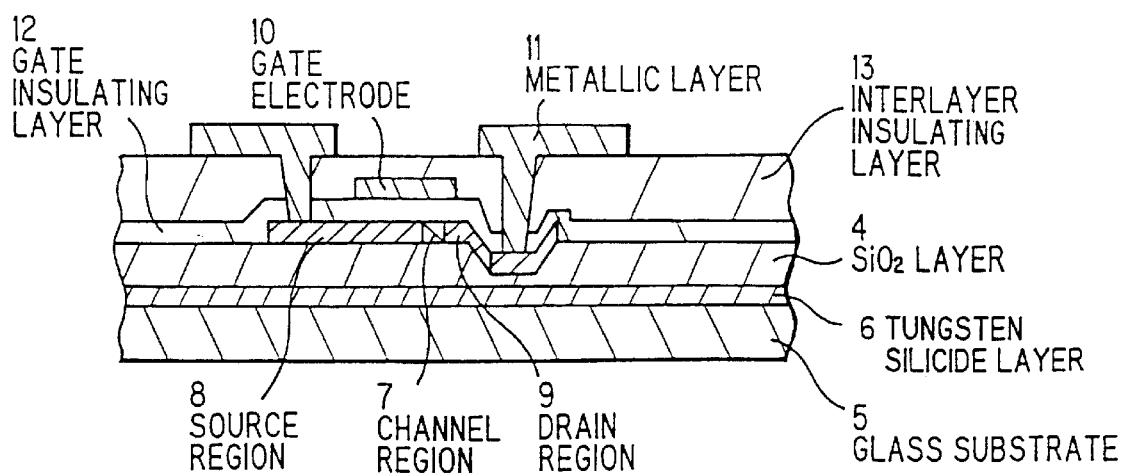

FIGS. 3A to 3C respectively show an outline of a method for fabricating the TFT according to the first preferred embodiment of the invention. Wherein FIG. 3A is a top view of a processed substrate in an early stage of a fabrication process. FIG. 3B is a cross-sectional view of the processed substrate shown in FIG. 3A taken along a line A—A. And FIG. 3C is a cross-sectional view for showing an outline of the processed substrate in the final stage of the fabrication process.

As shown in FIG. 3A, a Si layer 1 to 3 is formed on a top surface of the processed substrate in the early stage in the fabrication process, and explaining concretely, a tungsten silicide layer 6 serving as a cooling layer, a $SiO_2$ layer 4 serving as an insulating layer and the Si layer 1 to 3 are successively formed on a glass substrate 5.

A heat conductance of the tungsten silicide layer 6 is higher than that of the $SiO_2$ layer 4, and the tungsten silicide layer 6 covers almost a whole top surface of the glass substrate 5.

Accordingly, when the Si layer 1 to 3 is irradiated with a laser light to be crystallized, the tungsten silicide layer 6 conducts heat generated in the Si layer 1 to 3 with high efficiency, and cools the same.

Although the tungsten silicide layer 6 is exemplified as a cooling layer in FIG. 3B, a heat conductor of the other kind may be adopted for the same purpose.

A top surface of the tungsten silicide layer 6 is covered with the $SiO_2$ layer 4, on which a dent with a square shaped bottom surface is formed.

Since the bottom surface of the dent is closer to the tungsten silicide layer 6 serving as the cooling layer than the top surface of the $SiO_2$ layer 4 other than the dent, heat generated on the bottom surface of the dent is conducted to the tungsten silicide layer 6 the most effectively. Accordingly, the Si layer 2 formed on the bottom surface of the dent is cooled the earliest.

The Si layer 1 to 3 covers almost all the top surface of the $SiO_2$ layer 4 and the bottom and side surfaces of the dent.

If an excimer laser light is irradiated on a surface of the processed substrate on condition that the Si layer 1 to 3 is melted, the Si layer 1 to 3 is successively solidified after laser irradiation is over in the reverse order of a distance from the tungsten silicide layer 6 with the high heat conductance.

That is to say, since the Si layer 2 formed on the bottom surface of the dent is the closest to the tungsten silicide layer 6, heat generated therein is conducted to the cooling layer the most effectively after laser irradiation is over, and the Si layer 2 is cooled and solidified earlier than the Si layer 1, 3.

Explaining more concretely, since the Si layer 2 formed on the bottom surface of the dent is cooled earlier than the circumference thereof, the Si layer 2 is solidified with an incubation time $t_1$ and a crystalline nucleus density $n_1$, and the first polycrystalline Si region is formed.

Moreover, a Si crystal layer is grown in the Si layer 3 towards the side surfaces and circumference of the dent, because the Si layer 2 which begins to be solidified in the first polycrystalline Si region functions as nucleuses in the aforementioned crystallization.

At this time, a distance of crystal growth is determined by a point where the Si layer 3 collides with the second polycrystalline Si region (the Si layer 1), which is solidified with an incubation time $t_2$ ($t_1 < t_2$) and a nucleus density $n_2$ ($n_1 > n_2$), wherein a time of crystal growth $t_3$ is given by $t_2 - t_1$.

Accordingly, the Si layer 3 is grown on the basis of the first polycrystalline Si region (the Si layer 2) serving as nucleuses, and formed as a single crystal till it collides with the second polycrystalline Si region (the Si layer 1

As mentioned in the above, according to the aforementioned structure, a situation that the Si layer 1 to 3 is uniformly cooled, crystalline nucleuses are randomly generated after a particular incubation time has passed, crystal grains are randomly formed around the crystalline nucleuses, and grain boundaries are randomly formed in the recrystallization process by means of the excimer laser can be avoided.

That is to say, according to the TFT according to the invention, since solidification (recrystallization) starts from a particular position (the bottom surface of the dent) and proceeds to portions where solidification starts a certain time later in the recrystallization process, a single crystal can be grown from the bottom surface of the dent serving as nucleuses towards the outside circumference.

FIG. 3C shows a structure of the TFT comprising the Si layer 1 to 3 formed in this way.

A channel region 7, a source region 8 and a drain region 9 are successively formed in the processed substrate. Subsequently, a gate 10 separated from the active region by a gate insulating layer 12, a metallic layer 11 and an interlayer insulating layer 13 are provide for the processed substrate.

The channel region 7 can be formed of a single crystal layer by positioning the drain region 9 on the Si layer 2.

At this time, since the crystals start to grow from four sides around the bottom surface, there is a possibility that grain boundaries are formed along diagonals. However, the grain boundaries are prevented from being formed on the active region by shaping the drain region, the channel region and the source region into long and narrow rectangular configurations.

As a result, since the number of the grain boundaries is reduced, an off-leak current caused by grain boundary traps which is peculiar to the transistor formed of the polycrystalline Si can be radically reduced.

As mentioned in the above, the channel region 7 formed of a single crystal with no grain boundary can be formed by adjusting the incubation times $t_1$, $t_2$ and lengthening the crystal growth time $t_3$ represented as $t_1-t_2$.

As mentioned in the above, according to the TFT according to the first preferred embodiment of the invention, since a portion of the drain, channel and source regions locally approaches the cooling layer formed of highly heat conductive material, a single crystal is grown from the coolest portion which serves as crystalline nucleuses. Accordingly, in the TFT fabricated in this way, the off-leak current caused by the grain boundary traps can be radically reduced.

Moreover, according to the TFT according to the first preferred embodiment of the invention, in the thermal recrystallization process by means of the excimer laser, since the crystalline nucleuses are formed in an extremely short time in the order of nano second on the bottom surface of the dent and a Si layer formed of a single crystal or size-controlled crystal grains is grown around the aforementioned crystalline nucleuses, the off-leak current of the TFT can be precisely reduced.

In the above description, the explanations are given on a method for fabricating a TFT, in which the Si layer formed of a single crystal or size-controlled crystal grains is formed by providing the cooling layer and thereby the off-leak current caused by trap levels formed around the grain boundary can be radically reduced, hence the off-leak current of the TFT can be precisely reduced.

The structure of the TFT according to the first preferred embodiment of the invention, in which a portion of the drain region, the channel region or the source region closely approaches the cooling layer formed of highly heat conductive material, is never restricted to the structures shown in FIGS. 3A to 3C, and other various structures can be devised.

Next, the other structures will be explained referring to the appended drawings as examples of applications of the first preferred embodiment.

The First Example of Application

Figure 4A:
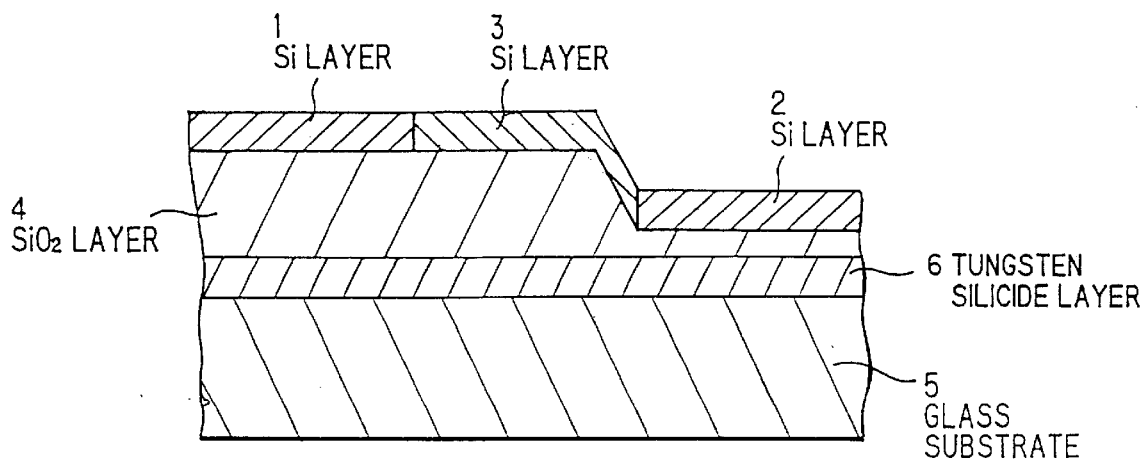
Figure 4B:
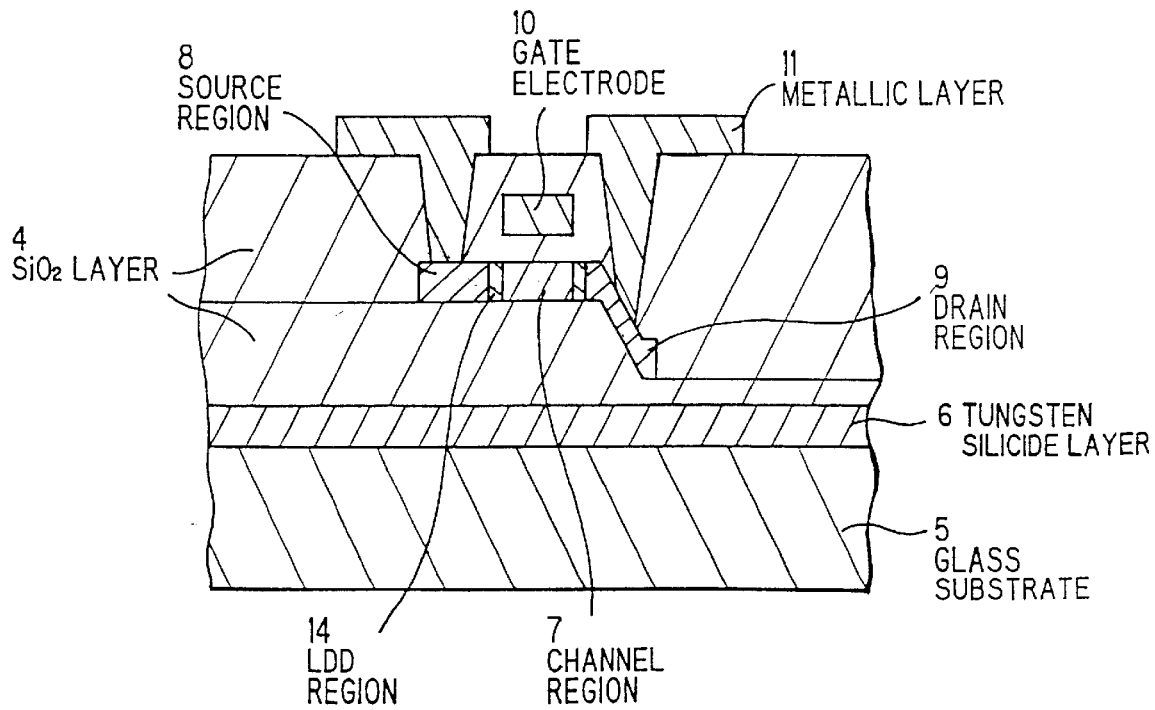

FIGS. 4A to 4B show an outline of a structure of a TFT according to the first example of application, wherein FIG. 4A is a cross-sectional view for showing a structure of the processed substrate in an early stage of a fabrication process, and FIG. 4B is a cross-sectional view for showing a structure of the TFT in the final stage of the fabrication process.

As shown in FIG. 4A, in the early stage of the fabrication process, the processed substrate is fabricated by successively forming a tungsten silicide layer 6 serving as a cooling layer, a $SiO_2$ layer 4 serving as an insulating layer and a Si layer 1 to 3 on a glass substrate 5.

A step is formed on a top surface of the $SiO_2$ layer 4, and the Si layer 2 is formed on a lower surface of the step.

Since $SiO_2$ layer 2 is the closest to the tungsten silicide layer 6, this portion is cooled the most effectively.

If an excimer laser is irradiated on the processed substrate having a structure shown in FIG. 4A on condition that the Si layer 1 to 3 is melted, the Si layer 1 to 3 is recrystallized after the laser irradiation is over. In this case, the Si layer 2 which is the closest to the tungsten silicide layer 6 is solidified firstly, and thereafter the Si layer 3 formed of a single crystal layer or size-controlled crystal grains is grown similarly to the first preferred embodiment.

Subsequently, a channel region 7, a source region 8 and a drain region 9 are formed of a Si layer 3 of a single crystal. Moreover, a gate 10 insulated by the $SiO_2$ layer and a metallic layer 11 are successively provided for the processed substrate.

According to the aforementioned process, since a single crystal is or size-controlled crystal grains are formed in the drain region and the neighborhood thereof (the channel region 7) in the TFT, the off-leak current in the drain region 9 which is peculiar to polycrystalline Si can be effectively reduced.

In this case, it is desirable that LDD regions 14 are formed at both the side ends of the channel region 7. According to the aforementioned structure, in case that two or three grain boundaries are uniformly formed, the trouble caused by the aforementioned defect can be compensated, and the off-leak current can be precisely reduced.

The other structure and the function are similar to those of the TFT according to the first preferred invention.

As mentioned in the above, in the TFT according to the first example of application, since the drain region 9, the channel region 7 and the source region 8 are formed of the single crystal layer, the off-leak current caused by grain boundary traps which is peculiar to polycrystalline Si can be precisely reduced.

The Second Example of Application

Figure 5A:
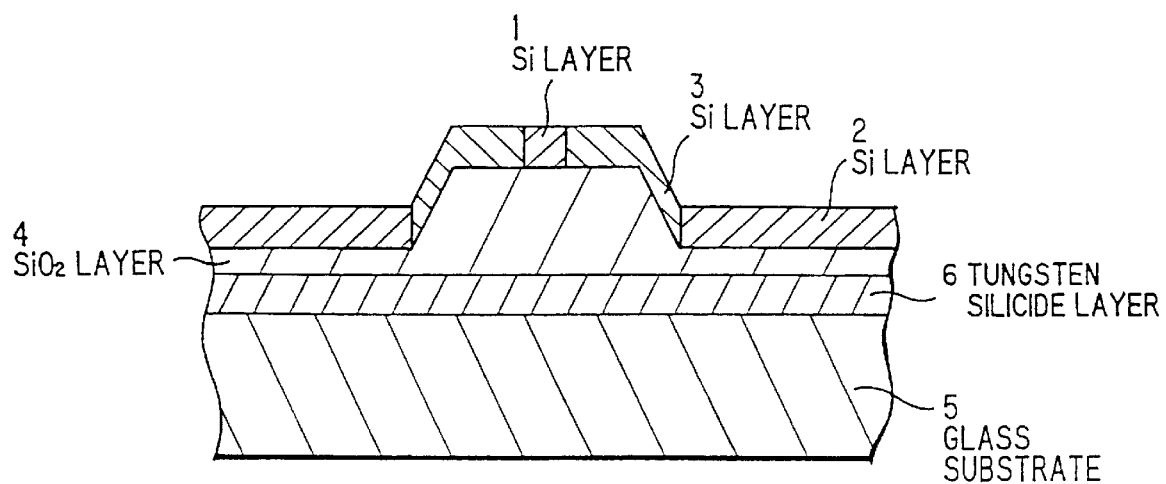
Figure 5B:
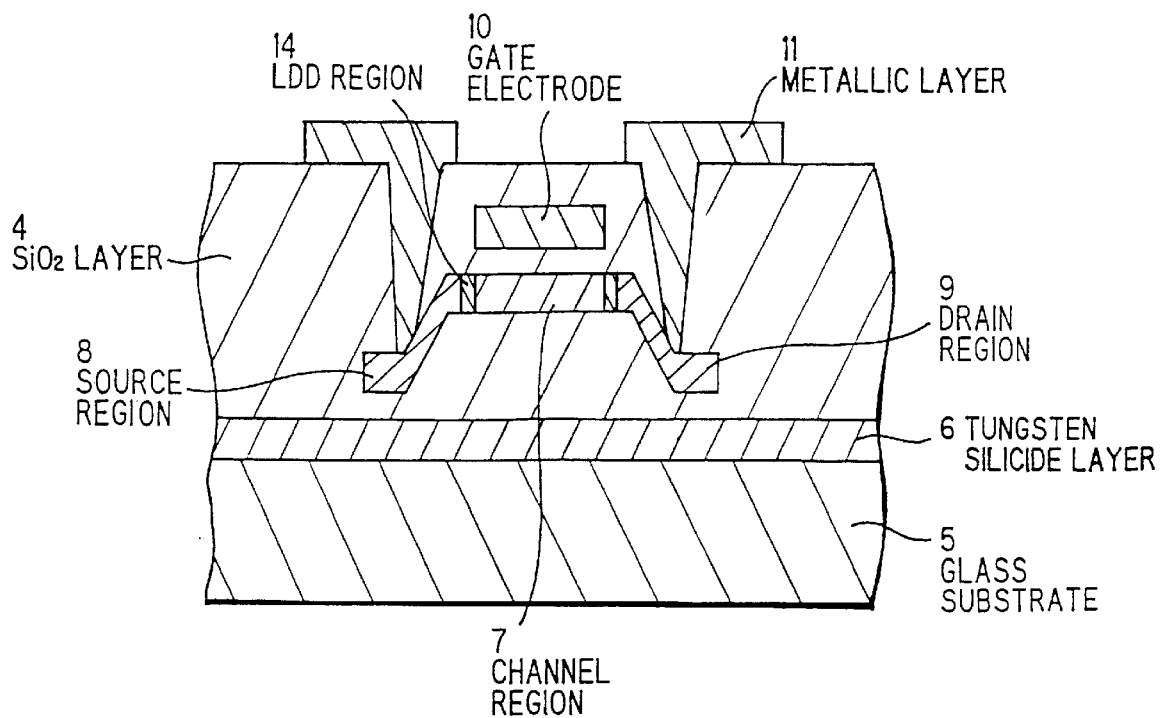

FIGS. 5A and 5B are cross-sectional views for showing an outline of a structure of a TFT according to the second example of application, wherein FIG. 5A shows a processed substrate in an early stage of a fabrication process, and FIG. 5B shows the TFT in the final stage of the fabrication process.

As shown in FIG. 5A, a tungsten silicide layer 6 serving as a cooling layer, a $SiO_2$ layer 4 serving as an insulating layer and a Si layer 1 to 3 are successively formed on a glass substrate 5.

A top surface of the $SiO_2$ layer 4 is provided with a ridge formed by two steps running in parallel with each other, and the Si layer 1 to 3 is formed thereon.

Since the lower surfaces of the steps are the closest to the tungsten silicide layer 6, they are cooled the most effectively.

If the processed substrate shown in FIG. 5A is irradiated with a pulse of an excimer laser on condition that the Si layer 1 to 3 is melted, the Si layer 2 which is the closest to the tungsten silicide layer 6 is recrystallized after the laser irradiation is over, and thereafter the Si layer 3 formed of a single crystal or size-controlled crystal grains is grown similarly to the first preferred embodiment.

In this case, it is desirable to make a width of the ridge be small. If the Si layers 3 which are grown from both the side walls of the ridge collide with each other at the middle of the top surface of the ridge before a Si layer 1 formed of a polycrystalline region is grown, a channel region 7 comprising a polycrystalline region with a narrow width can be obtained.

Subsequently, a channel region 7, a source region 8 and a drain region 7 are formed on the processed substrate. Then, a gate 10 insulated by the SiO$_2$ layer 4 and a metallic layer 11 are successively provided for the processed substrate to fabricate TFT.

In the TFT according to the invention, since the source region 8 and the drain region 9 are formed in a single crystal region 3 and the channel region 7 is formed in a region formed of size-controlled crystal grains including a single crystal regions 3, an off-leak current caused by grain boundary traps peculiar to polycrystalline Si is suppressed, and contrast of a picture can be improved when the TFT is applied to a pixel-driving device of a LCD. The other structure and the function are similar to those of the TFT according to the first example of application.

The Third Example of Application

Figure 6A:
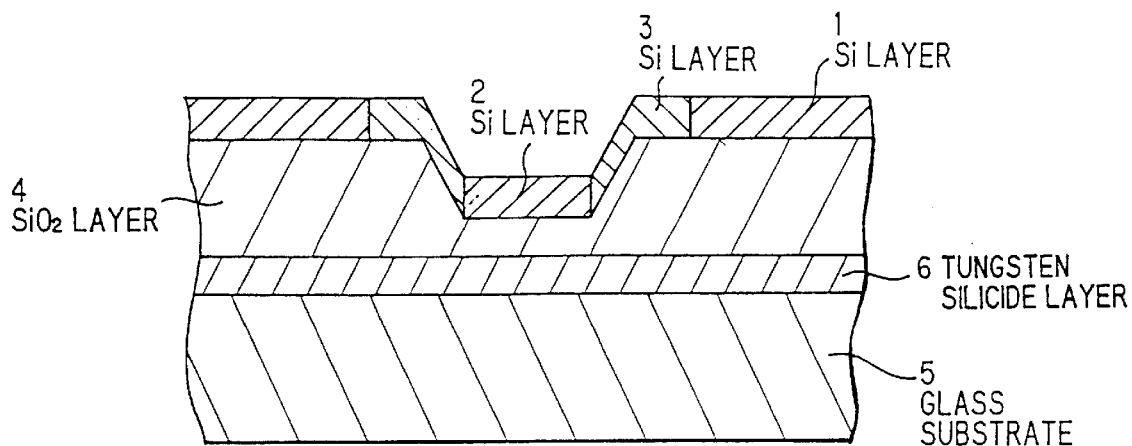
Figure 6B:
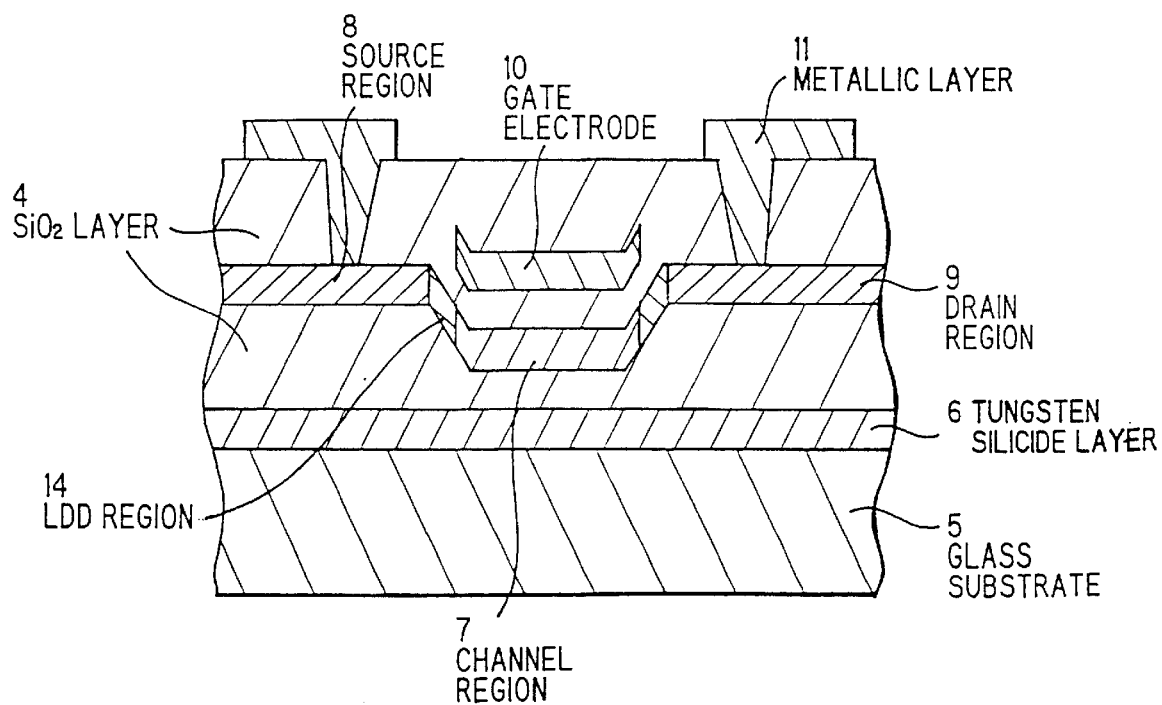

FIGS. 6A and 6B show an outline of a structure of a TFT according to the third example of application, wherein FIG. 6A shows a structure of a processed substrate in an early stage of a fabrication process, and FIG. 6B shows a structure of a TFT in the final stage of a fabrication process.

As shown in FIG. 6A, the processed substrate is formed by successively forming a tungsten silicide layer 6 serving as a cooling layer, a SiO$_2$ layer 4 serving as an insulating layer, and a Si layer 1 to 3 on a glass substrate 5.

A single trench is formed on a top surface of the SiO$_2$ layer 4 and the Si layer 1 to 3 is formed on the SiO$_2$ layer 4 including the trench. Since the bottom surface of the trench is the closest to the tungsten silicide layer 6, it is cooled the most effectively.

If the processed substrate is irradiated with a pulse of an excimer laser on condition that the Si layer 1 to 3 is melted, the Si layer 2 which is the closest to the tungsten silicide layer 6 is solidified firstly in case that the Si layer 1 to 3 is recrystallized after the laser light irradiation is over, and the Si layer 3 formed of single crystals or size-controlled crystal grains can be grown on both the sides of the Si layer.

In this case, it is desirable to make a width of the trench be small. According to the aforementioned structure, since a region of the Si layer 1 formed of polycrystalline Si can be narrowed and the Si layer 3 formed of a single crystal or size-controlled crystal grains can be widened, the channel region 7 with a narrow polycrystalline region can be obtained.

Subsequently, a portion of a channel region 7, a source region 8 and a drain region 9 are formed of the single crystal Si layer 3 in the processed substrate, and the SiO$_2$ layer 4 serving as a gate insulating layer, a gate 10 and a metallic layer 11 are provided for the processed substrate to fabricate a TFT.

The other structure and the function are similar to those of the TFT according to the first example of application.

The Fourth Example of Application

Figure 7A:
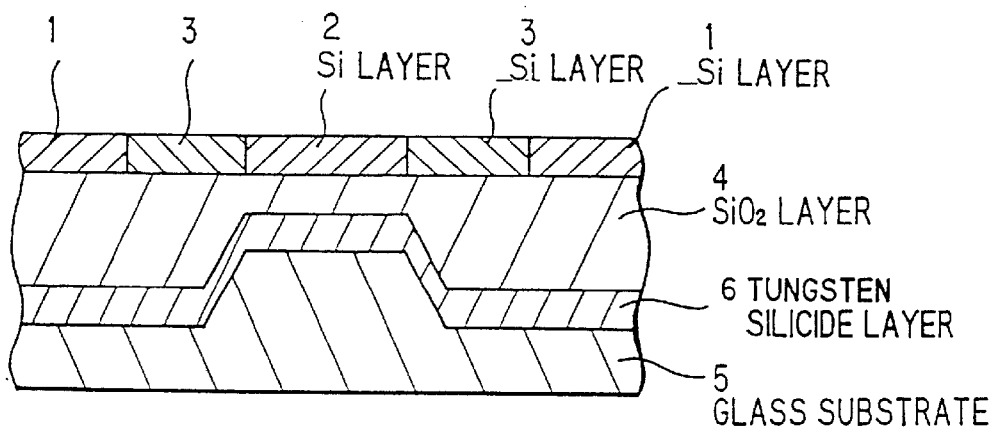
Figure 7B:
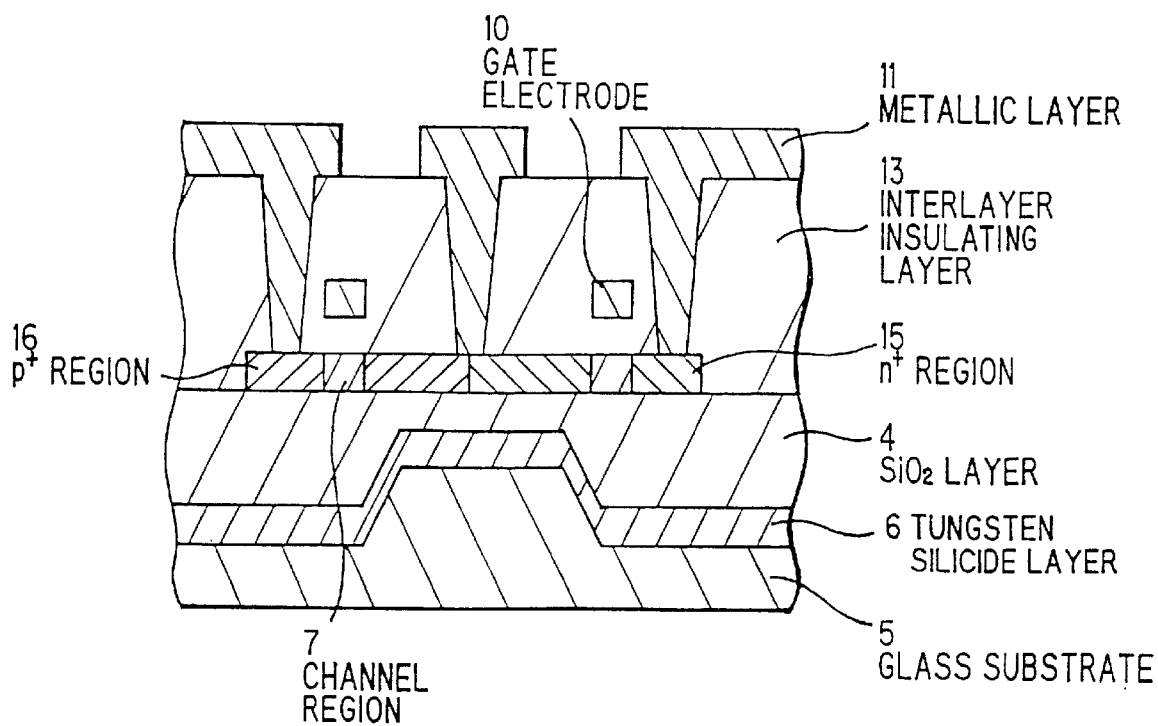

FIGS. 7A and 7B show an outline of a structure of a complementary MOS (CMOS) using TFTs, wherein FIG. 7A is a cross-sectional view for showing a processed substrate in an early stage of a fabrication process, and FIG. 7B is a cross-sectional view for showing a structure of the CMOS in the final stage of the fabrication process.

As shown in FIG. 7A, a glass substrate 5 is provided with a ridge. A tungsten silicide layer 6 with a uniform thickness, a SiO$_2$ layer 4 with a flat top surface and a Si layer 1 to 3 are successively formed on the glass-substrate 5.

In the processed substrate shown in FIG. 7A, the Si layer 2 is the closest to the tungsten silicide layer 6, hence it is cooled the most effectively.

The ridge is formed in such a way that differences in level are previously formed on the glass substrate and the tungsten silicide layer 6 is deposited thereon.

The method for forming the ridge is not restricted to the substrate-processing. The ridge can be obtained by depositing an oxidized layer or a nitride layer on a substrate and subsequently pattering the deposited layer, or by forming a convex portion on tungsten silicide.

If the processed substrate with the aforementioned structure is irradiated with a pulse of an excimer laser on condition that the Si layer 1 to 3 is melted, the Si layer 2 which is the closest to the tungsten silicide layer 6 is solidified firstly in case that the Si layer 1 to 3 is recrystallized after laser irradiation is over, and the Si layers 3 formed of single crystal or size-controlled crystal grains can be grown on both the sides of the Si layer.

Figure 8:
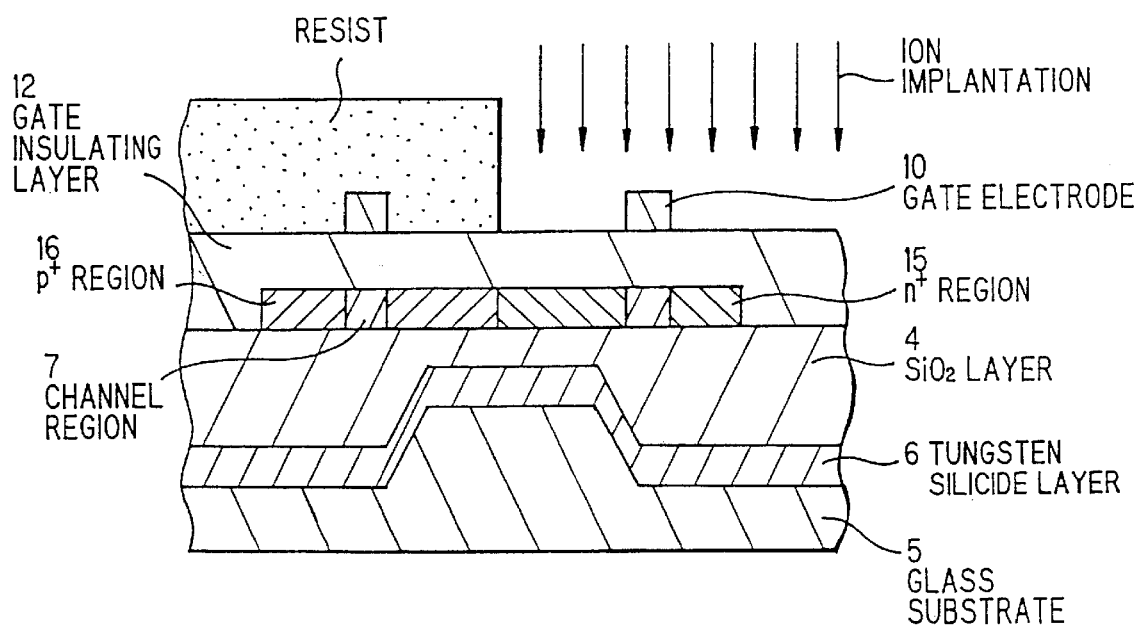
FIG. 8 is a cross-sectional view for showing a CMOS in the middle of a fabrication process.

In the CMOS circuit comprising the Si layer 1 to 3 formed in this way, source regions and drain regions are formed by ion implantation as shown in FIG. 8, after a gate insulating layer 12 and gate electrodes 10 are formed.

A n+ region 15 and A p+ region 16 are separately formed by individually implanting P and B ions by means of a resist, and the CMOS circuit is formed. As shown in FIG. 7B, after an interlayer insulating layer 13 and contact holes are formed, a wiring is conducted by a metallic layer 11.

Although a region where the n+ region 15 makes into contact with the p+ region 16 is formed of a polycrystalline region, it is desirable that this region is formed of a single crystal.

As mentioned in the above, in the CMOS circuit using the TFTs according to the first preferred embodiment, since the channel regions 7 can be formed of single crystal regions, the off-leak currents can be reduced, and as a result, consumed currents can be reduced.

As explained in the above on the basis of several examples of application, according to the TFT according to the invention, since the engineer in the field of the semiconductor device is supplied with a wide range of choice in designing the structures of the cooling layer and the active region (the drain, channel and source regions) he can select the most suitable way for designing the TFT in accordance with his object, and, as a result, provide the TFT with a high performance.

Moreover, as a modification of the aforementioned method for fabricating the TFT, another method that a cooling layer is formed and patterned on a semiconductor layer, the semiconductor layer and the cooling layer are irradiated with an energy beam and crystalline nucleuses are firstly formed in the semiconductor layer lying under the cooling layer can be devised.

According to the aforementioned method, a similar effect (a Si layer 3 formed of a single crystal or size-controlled crystal grains) can be obtained also, and an off-leak current can be radically and precisely reduced.

The TFT according to the invention is widely used for various electronic instruments.

Figure 9:
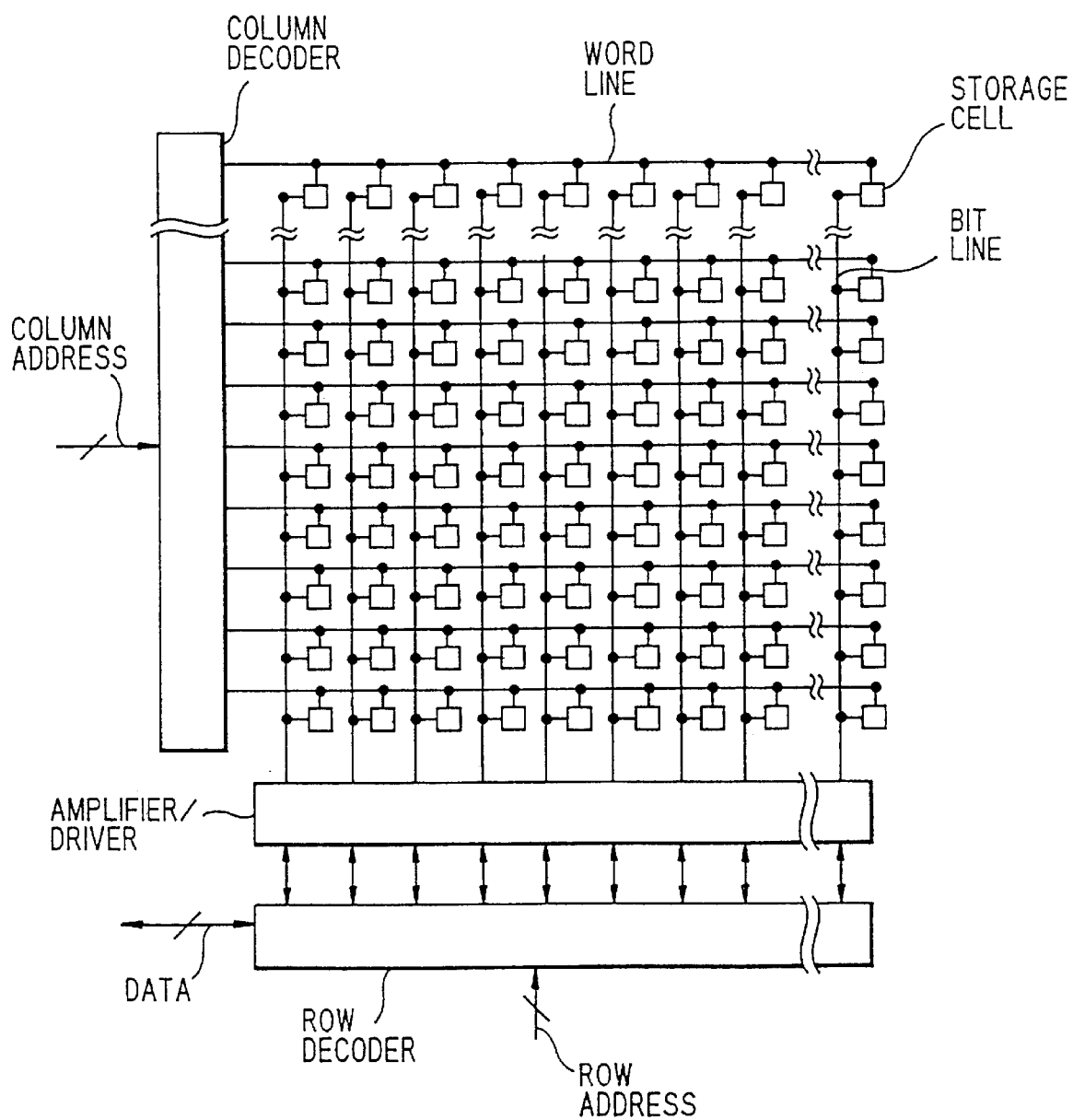
FIG. 9 shows an outline of a semiconductor memory device using TFTs according to the invention.

For examples, a semiconductor memory device shown in FIG. 9 can be constructed by means of the TFTs according to the invention.

The semiconductor memory device is composed of 2n×2 m bits memory cells, and TFTs is used as the memory cells.

Figure 10:
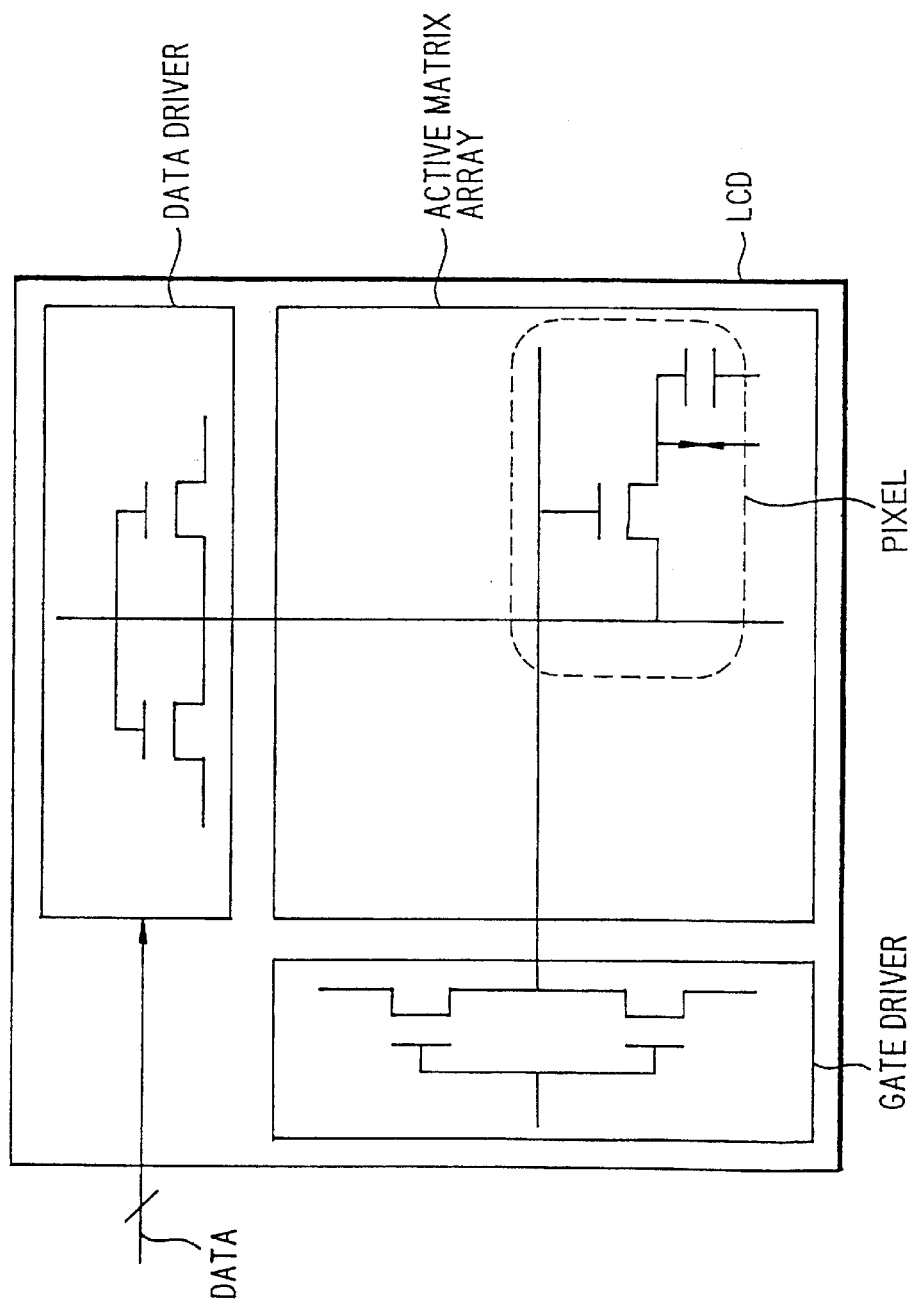
FIG. 10 shows an outline of a LCD using TFTs according to the invention.
Figure 11:
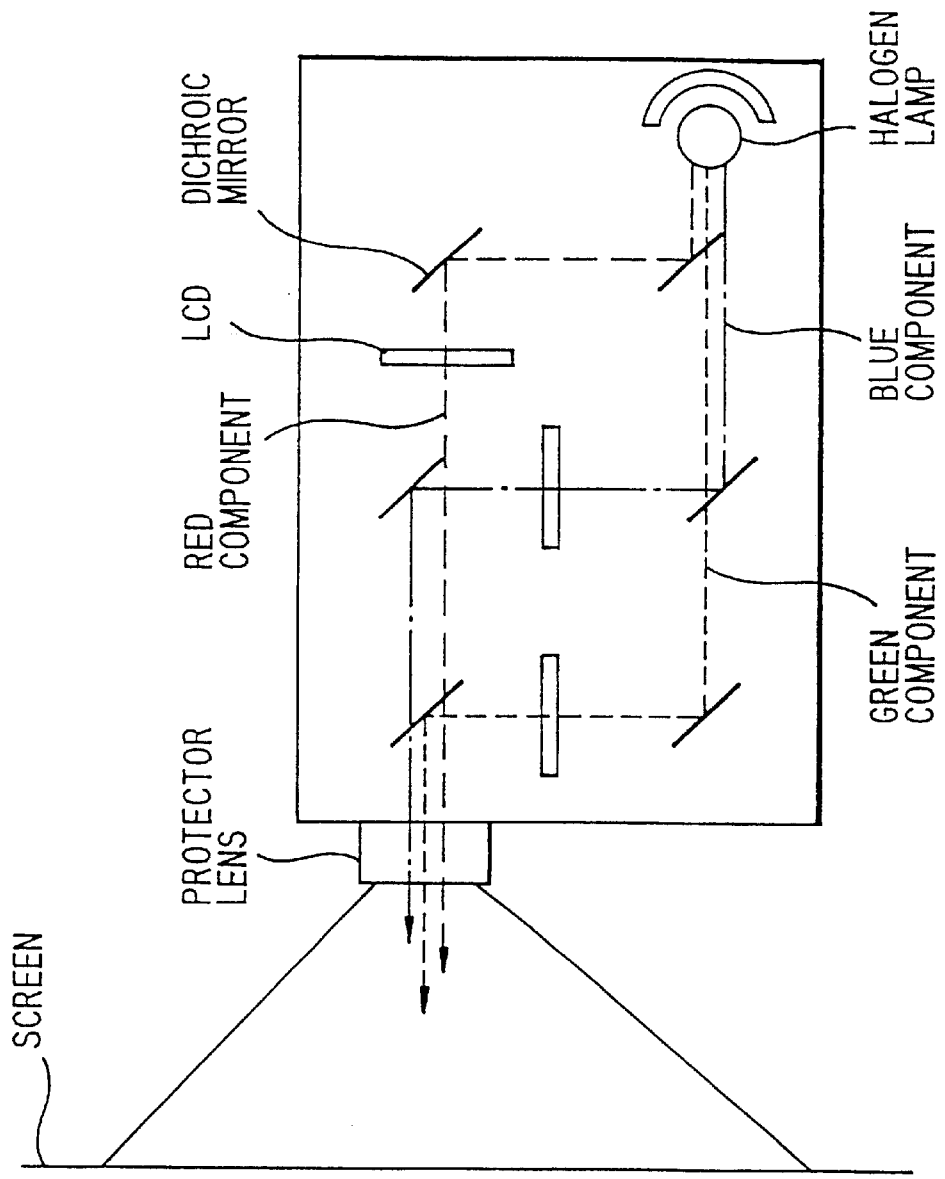
FIG. 11 shows an outline of a projector using TFTs according to the invention.

Furthermore, the TFT according to the invention can be used in a LCD as shown in FIG. 10, and FIG. 11 shows an outline of a projector using the LCD shown in FIG. 10.

In FIG. 10, a pixel of a LCD connected with the active matrix array is driven by peripheral driving circuits (a data driver and a gate driver) In this case, the TFTs are used in the data driver, the gate driver and the pixel-TFT.

As shown in FIG. 11, in the projector, each of lights generated by a halogen lamp is supplied to the LCD via a dichroic mirror, and an image thereof is projected on a screen via a projector lens. In this case, the LCDs respectively corresponding to the red, green and blue components are used.

Figure 12A:
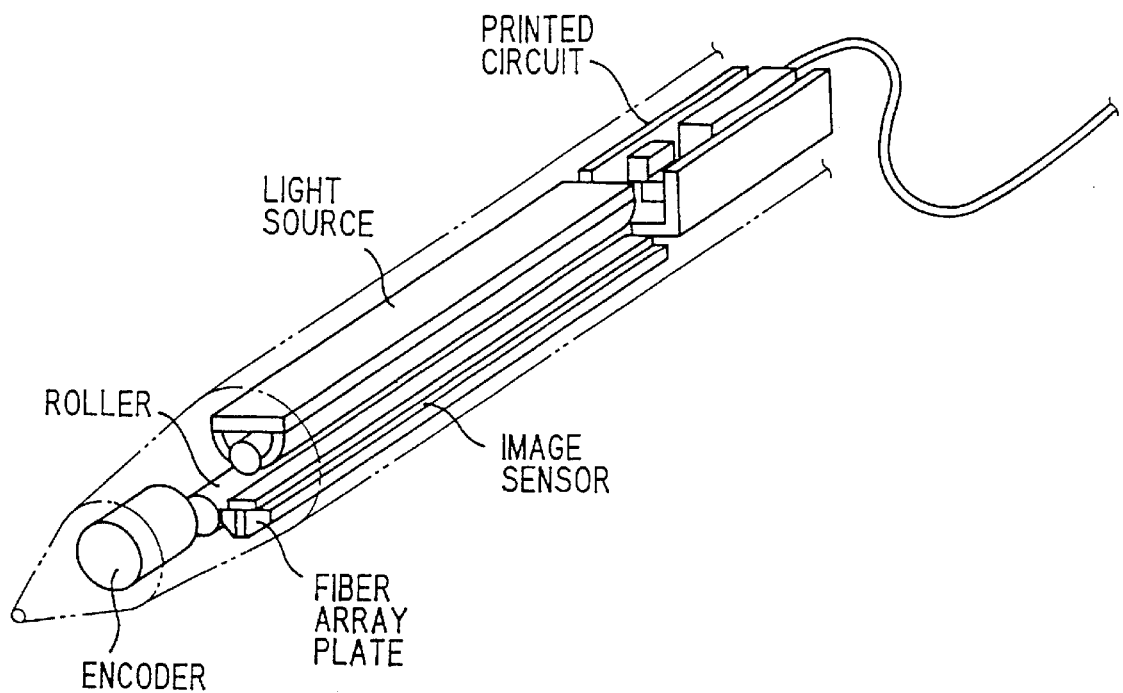
Figure 12B:
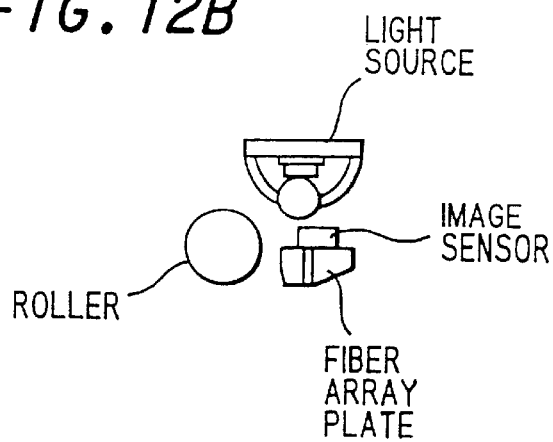

Stillmore, the TFT according to the invention can be applied to a portable scanner shown in FIGS. 12A and 12B, and explaining concretely the TFTs are used for driving amorphous Si photodiodes.

The image sensor is composed of the amorphous Si photodiodes, a shift register which is composed of the TFTs and controls a scan in the main scanning direction, and read switches.

The portable scanner is provided with a light source, an image sensor and a fiber array plate. A picture on a manuscript is illuminated by the light source situated behind the image sensor, and read by means of the fiber array plate.

A picture signal read by the image sensor is scanned in the sub-scanning direction by means of a roller and an encoder, and outputted to a computer or a recording apparatus.

Although an explanation is given on the portable scanner, the TFT according to the invention can be applied to a flat bed type scanner, a facsimile, a digital duplicator or a two dimensional sensor.

As mentioned in the above, in the TFT according to the invention, when a Si layer formed on an insulator is irradiated with a pulse of an excimer laser light on condition that the Si layer is melted, crystalline nucleuses are formed in a portion corresponding to an active region (a drain region, a channel region and a source region) which is locally close to a cooling layer, and rescrystallization starts from the crystalline nucleuses towards regions in which the melted Si layer is cooled a certain time later.

Accordingly, a Si layer formed of a single crystal or size-controlled crystal grains can be obtained in the neighborhood of the crystalline nucleuses, and the TFT provided with the aforementioned Si layer can radically reduce an off-leak current caused by trap levels generated in a polycrystalline region.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for fabricating a thin film transistor, comprising the steps of:

forming a cooling layer with a high heat conductivity on a substrate, forming an insulating layer with a lower heat conductivity than that of said cooling layer on said cooling layer, locally thinning said insulating layer to a first thickness and wherein at least one region has a second thickness, growing a semiconductor layer on said locally thinned insulating layer, and irradiating said locally thinned insulating layer with an energy beam.

2. The method of claim 1, wherein said cooling layer is locally close in the insulating region having the least thickness to at least one of a drain region, a channel region and a source region included in an active layer composed of said semiconductor layer grown on said locally thinned insulating layer.

3. The method of claim 2, wherein a part of said active layer is a single crystal layer and another part is a non-single crystal layer.

4. The method of claim 3, wherein said source region and said drain region are in said single crystal layer and said channel region is in said non-single crystal layer.

5. A method of fabricating a thin film transistor on an insulating layer formed on a substrate, comprising:

forming an insulated gate electrode;

forming an active layer by growing a semiconductor layer on said insulating layer, wherein said active layer includes a source region, a drain region and a channel region, and wherein a part of said active layer is a single crystal layer and another part is a non-single crystal layer.

6. The method of claim 5, wherein said source region and said drain region are in said single crystal layer and said channel region is in said non-single crystal layer.

* * * * *